United States Patent
Wang

(10) Patent No.: US 9,965,985 B2
(45) Date of Patent: May 8, 2018

(54) SHIFT REGISTER AND METHOD FOR DRIVING THE SAME, GATE DRIVING CIRCUIT AND DISPLAY APPARATUS

(71) Applicants: BOE Technology Group Co., Ltd., Beijing (CN); Ordos Yuansheng Optoelectronics Co., Ltd., Inner Mongolia (CN)

(72) Inventor: Jiguo Wang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 213 days.

(21) Appl. No.: 15/146,089

(22) Filed: May 4, 2016

(65) Prior Publication Data

US 2017/0092172 A1 Mar. 30, 2017

(30) Foreign Application Priority Data

Sep. 25, 2015 (CN) .......................... 2015 1 0624890

(51) Int. Cl.
*G11C 19/00* (2006.01)
*G09G 3/20* (2006.01)
(Continued)

(52) U.S. Cl.
CPC .............. *G09G 3/20* (2013.01); *G11C 19/00* (2013.01); *G09G 3/3266* (2013.01);
(Continued)

(58) Field of Classification Search
None
See application file for complete search history.

(56) References Cited

U.S. PATENT DOCUMENTS

2016/0125955 A1 5/2016 Pang
2016/0293092 A1* 10/2016 Li ............................ G09G 3/20
(Continued)

FOREIGN PATENT DOCUMENTS

CN 102956213 A 3/2013
CN 104299590 A 1/2015
(Continued)

OTHER PUBLICATIONS

First Office Action, including Search Report, for Chinese Patent Application No. 201510624890.8, dated May 12, 2017, 5 pages.

*Primary Examiner* — Tuan T Lam
(74) *Attorney, Agent, or Firm* — Westman, Champlin & Koehler, P.A.

(57) ABSTRACT

The present disclosure discloses a shift register and a method for driving the same, a gate driving circuit and a display apparatus. The shift register comprises an input module, a reset module, a first control module, a second control module, a first output module and a second output module. With cooperation among the above six modules, the shift register enables the potential at the third node for controlling the first output module to be in a stable state under the function of the first control module and enables the potential at the fourth node for controlling the second output module to be in a stable state under the function of the second control module. In this way, stability of the scanning signal output by the driving signal output end of the shift register is achieved, thereby reducing the noise in the scanning signal output by the driving signal output end, and improving the stability of the output of the shift register.

20 Claims, 11 Drawing Sheets

(51) Int. Cl.
G09G 3/36 (2006.01)
G11C 19/28 (2006.01)
G09G 3/3266 (2016.01)

(52) U.S. Cl.
CPC ... *G09G 3/3677* (2013.01); *G09G 2300/0408* (2013.01); *G09G 2310/0267* (2013.01); *G09G 2310/0286* (2013.01); *G09G 2310/061* (2013.01); *G09G 2320/0223* (2013.01); *G11C 19/28* (2013.01)

(56) References Cited

U.S. PATENT DOCUMENTS

| | | | |
|---|---|---|---|
| 2016/0300623 A1 | 10/2016 | Yang et al. | |
| 2016/0322115 A1 | 11/2016 | Xu et al. | |
| 2017/0061913 A1* | 3/2017 | Wang | G09G 3/36 |
| 2017/0092212 A1* | 3/2017 | Wang | G09G 3/20 |
| 2017/0193887 A1* | 7/2017 | Wang | G09G 3/2092 |
| 2017/0200418 A1* | 7/2017 | Zhang | G09G 3/3266 |

FOREIGN PATENT DOCUMENTS

| | | |
|---|---|---|
| CN | 104715710 A | 6/2015 |
| CN | 104766586 A | 7/2015 |
| KR | 10-2014-0076851 A | 6/2014 |

\* cited by examiner

SHIFT REGISTER AND METHOD FOR DRIVING THE SAME, GATE DRIVING CIRCUIT AND DISPLAY APPARATUS

CROSS-REFERENCE TO RELATED APPLICATION(S)

This application claims priority to the Chinese Patent Application No. 201510624890.8, filed on Sep. 25, 2015, entitled "SHIFT REGISTER AND METHOD FOR DRIVING THE SAME, GATE DRIVING CIRCUIT AND DISPLAY APPARATUS" which is incorporated herein by reference in its entirety.

TECHNICAL FIELD

The present disclosure relates to the field of display technology, and more particularly, to a shift register and a method for driving the same, a gate driving circuit and a display apparatus.

BACKGROUND

With the rapid development of display technology, displays have a development trend to high integrity and a low cost. The Gate Driver on Array (GOA) technology is to integrate a gate switch circuit of a Thin Film Transistor (TFT) onto an array substrate of a display panel to achieve scanning and driving of the display panel, so as to omit a bonding region and a wiring space of a fan-out region of an Integrated Circuit (IC). This can not only reduce a product cost in terms of a material cost and manufacturing processes, but also can achieve an aesthetic design of the display panel with two symmetrical sides and a narrow frame. Further, such integration process can further omit bonding processes in the direction of gate scanning lines, so as to improve the productivity and yield.

Generally, the existing GOA circuit is comprised of multiple cascaded shift registers. Each of driving signal output ends of various stages of shift registers corresponds to a gate line, to arrange various gate lines in turn along a scanning direction. However, shift registers used in most GOA circuits are currently under the control of a clock signal, in which case a node for controlling a switch transistor for output will always be in a floating state, and a potential at the node will be influenced by current leakage from surrounding switch transistors, and thereby a potential at a gate of the switch transistor for output is unstable. In this case, a noise in a scanning signal output by a driving signal output end is large, thereby influencing stability of output of the shift register.

SUMMARY

Embodiments of the present disclosure provide a shift register and a method for driving the same, a gate driving circuit, and a display apparatus, to reduce a noise in a scanning signal output by a driving signal output end of the shift register, and improve stability of output of the shift register.

Therefore, the embodiments of the present disclosure provide a shift register, comprising:

an input module having a first end connected to an input signal end, a second end connected to a first reference signal end, a third end connected to a first clock signal end, a fourth end connected to a first node, and a fifth end connected to a second node, the input module being configured to provide a signal from the first reference signal end to the first node under the control of the input signal end, and provide a signal from the first clock signal end to the second node under the control of the first reference signal end;

a reset module having a first end connected to a reset signal end, a second end connected to a second reference signal end, a third end connected to a second clock signal end, a fourth end connected to the first node, and a fifth end connected to the second node, the reset module being configured to provide a signal from the second reference signal end to the first node under the control of the reset signal end, and provide a signal from the second clock signal end to the second node under the control of the second reference signal end;

a first control module having a first end connected to a first direct current signal end, a second end connected to a second direct current signal end, a third end connected to the first node, a fourth end connected to a third node, and a fifth end connected to a fourth node, the first control module being configured to provide a signal from the first direct current signal end to the third node under the control of the first node, provide a signal from the second direct current signal end to the third node under the control of the fourth node, and maintain a potential at the third node in a stable state when the third node is in a floating state;

a second control module having a first end connected to the first direct current signal end, a second end connected to the second direct current signal end, a third end connected to the second node, a fourth end connected to the third node, and a fifth end connected to the fourth node, the second control module being configured to provide the signal from the first direct current signal end to the fourth node under the control of the second node, provide the signal from the second direct current signal end to the fourth node under the control of the third node, and maintain a potential at the fourth node in a stable state when the fourth node is in a floating state;

a first output module having a first end connected to a third clock signal end, a second end connected to the third node, and a third end connected to a driving signal output end of the shift register, the first output module being configured to provide a signal from the third clock signal end to the driving signal output end under the control of the third node; and a second output module having a first end connected to the second direct current signal end, a second end connected to the fourth node, and a third end connected to the driving signal output end, the second output module being configured to provide the signal from the second direct current signal end to the driving signal output end under the control of the fourth node.

In a possible implementation, the above shift register according to the embodiments of the present disclosure further comprises: a noise reduction module, having a first end connected to the second direct current signal end, a second end connected to the driving signal output end, and a third end connected to the fourth node, the noise reduction module being configured to provide the signal from the second direct current signal end to the fourth node under the control of the driving signal output end.

In a possible implementation, in the above shift register according to the embodiments of the present disclosure, the input module comprises:

a first switch transistor having a gate connected to the input signal end, a source connected to the first reference signal end, and a drain connected to the first node; and a second switch transistor having a gate connected to the first reference signal end, a source connected to the first clock signal end, and a drain connected to the second node.

In a possible implementation, in the above shift register according to the embodiments of the present disclosure, the reset module comprises:

a third switch transistor having a gate connected to the reset signal end, a source connected to the first node, and a drain connected to the second reference signal end; and a fourth switch transistor having a gate connected to the second reference signal end, a source connected to the second node, and a drain connected to the second clock signal end.

In a possible implementation, in the above shift register according to the embodiments of the present disclosure, the first control module comprises:

a fifth switch transistor having a gate connected to the first node, a source connected to the first direct current signal end, and a drain connected to the third node;

a sixth switch transistor having a gate connected to the fourth node, a source connected to the third node, and a drain connected to the second direct current signal end; and a first capacitor having one end connected to the third node and the other end connected to the second direct current signal end.

In a possible implementation, in the above shift register according to the embodiments of the present disclosure, the first control module further comprises a seventh switch transistor connected between the source of the fifth switch transistor and the first direct current signal end, wherein the seventh switch transistor has a gate and a source both connected to the first direct current signal end, and a drain connected to the source of the fifth switch transistor.

In a possible implementation, in the above shift register according to the embodiments of the present disclosure, the second control module comprises:

an eighth switch transistor having a gate connected to the second node, a source connected to the first direct current signal end, and a drain connected to the fourth node;

a ninth switch transistor having a gate connected to the third node, a source connected to the fourth node, and a drain connected to the second direct current signal end; and a second capacitor having one end connected to the fourth node and the other end connected to the second direct current signal end.

In a possible implementation, in the above shift register according to the embodiments of the present disclosure, the first output module comprises:

a tenth switch transistor having a gate connected to the third node, a source connected to the third clock signal end, and a drain connected to the driving signal output end.

In a possible implementation, in the above shift register according to the embodiments of the present disclosure, the first output module further comprises an eleventh switch transistor connected between the gate of the tenth switch transistor and the third node, wherein the eleventh switch transistor has a gate connected to the first direct current signal end, a source connected to the gate of the tenth switch transistor, and a drain connected to the third node.

In a possible implementation, in the above shift register according to the embodiments of the present disclosure, the second output module comprises:

a twelfth switch transistor having a gate connected to the fourth node, a source connected to the driving signal output end, and a drain connected to the second direct current signal end.

In a possible implementation, in the above shift register according to the embodiments of the present disclosure, the noise reduction module comprises:

a thirteenth switch transistor having a gate connected to the driving signal output end, a source connected to the fourth node, and a drain connected to the second direct current signal end.

Further, in the above shift register according to the embodiments of the present disclosure, when an active pulse signal for the signal from the input signal end is at a high potential, all of the switch transistors are N-type switch transistors; and when the active pulse signal for the signal from the input signal end is at a low potential, all of the switch transistors are P-type switch transistors.

Correspondingly, the embodiments of the present disclosure further provide a method for driving any of the shift registers described above, comprising:

in an input phase, providing, by the input module, the signal from the first reference signal end to the first node under the control of the input signal end, and providing the signal from the first clock signal end to the second node under the control of the first reference signal end; providing, by the first control module, the signal from the first direct current signal end to the third node under the control of the first node; providing, by the second control module, the signal from the second direct current signal end to the fourth node under the control of the third node; and providing, by the first output signal end, the signal from the third clock signal end to the driving signal output end under the control of the third node;

in an output phase, providing, by the input module, the signal from the first clock signal end to the second node under the control of the first reference signal end; maintaining, by the first control module, the potential at the third node in a stable state; providing, by the second control module, the signal from the second direct current signal end to the fourth node under the control of the third node; and providing, by the first output module, the signal from the third clock signal end to the driving signal output end under the control of the third node;

in a reset phase, providing, by the input module, the signal from the first clock signal end to the second node under the control of the first reference signal end; providing, by the reset module, the second reference signal to the first node under the control of the reset signal end; providing, by the first control module, the signal from the second direct current signal end to the third node under the control of the fourth node; and providing, by the second control module, the signal from the first direct current signal end to the fourth node under the control of the second node; and providing, by the second output module, the signal from the second direct current signal end to the driving signal output end under the control of the fourth node; and in a reset-hold phase, providing, by the input module, the signal from the first clock signal end to the second node under the control of the first reference signal end; providing, by the first control module, the signal from the second direct current signal end to the third node under the control of the fourth node; maintaining, by the second control module, the potential at the fourth node in a stable state; and providing, by the second output module, the signal from the second direct current signal end to the driving signal output end under the control of the fourth node.

In a possible implementation, the above method according to the embodiments of the present disclosure further comprises: in the output phase, providing, by the noise reduction module, the signal from the second direct current signal end to the fourth node under the control of the driving signal output end.

Correspondingly, the embodiments of the present disclosure further provide a gate driving circuit, comprising multiple cascaded shift registers according to the embodiments of the present disclosure described above, wherein, an input signal end of a first stage of shift register is connected to a frame trigger signal end; each of input signal ends of remaining various stages of shift registers except for the first stage of shift register is connected to a driving signal output end of a previous stage of shift register; and each of reset signal ends of the remaining various stages of shift registers except for a last stage of shift register is connected to a driving signal output end of a next stage of shift register.

Correspondingly, the embodiments of the present disclosure further provide a display apparatus comprising any gate driving circuit according to the embodiments of the present disclosure described above.

The embodiments of the present disclosure provide the shift register and the method for driving the same, the gate driving circuit and the display apparatus described above. The shift register comprises an input module, a reset module, a first control module, a second control module, a first output module, and a second output module. The input module controls potentials at the first node and the second node through the input signal end, the first reference signal end, and the first clock signal end. The reset module controls the potentials at the first node and the second node through the reset signal end, the second reference signal end, and the second clock signal end. The first control module controls the potential at the third node through the first direct current signal end, the second direct current signal end, the first node, and the fourth node. The second control module controls the potential at the fourth node through the first direct current signal end, the second direct current signal end, the second node, and the third node. The first output module controls a potential at the driving signal output end through the third clock signal end and the third node. The second output module controls the potential at the driving signal output end through the second direct current signal end and the fourth node. With cooperation among the above six modules, the shift register enables the potential at the third node for controlling the first output module to be in a stable state under the function of the first control module and enables the potential at the fourth node for controlling the second output module to be in a stable state under the function of the second control module. In this way, stability of the scanning signal output by the driving signal output end of the shift register is achieved, thereby reducing the noise in the scanning signal output by the driving signal output end, and improving the stability of the output of the shift register.

BRIEF DESCRIPTION OF THE DRAWINGS

FIG. 2a is a specific structural diagram of the shift register illustrated in FIG. 1a;

FIG. 2b is another specific structural diagram of the shift register illustrated in FIG. 1a;

FIG. 4a is a circuit timing diagram of the shift register illustrated in FIG. 2a;

FIG. 4c is a circuit timing diagram of the shift register illustrated in FIG. 3a;

DETAILED DESCRIPTION

Specific implementations of a shift register and a method for driving the same, a gate driving circuit, and a display apparatus according to embodiments of the present disclosure will be described in detail below in conjunction with accompanying drawings.

Figure 1A:
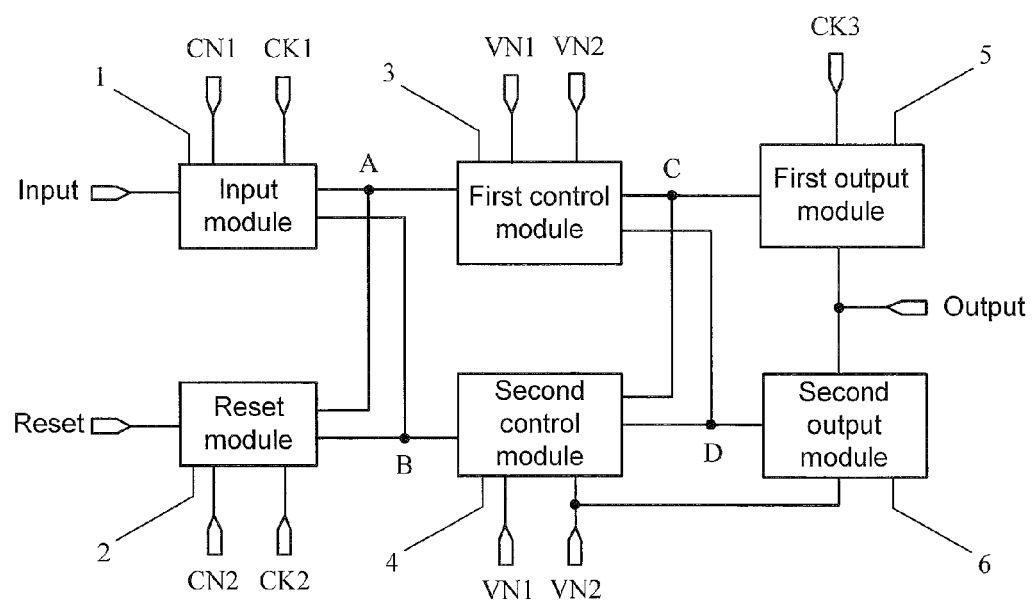
FIG. 1a is a structural diagram of a shift register according to an embodiment of the present disclosure.

As shown in FIG. 1a, the shift register according to the present embodiment comprises: an input module 1, a reset module 2, a first control module 3, a second control module 4, a first output module 5, and a second output module 6.

The input module 1 has a first end connected to an input signal end Input, a second end connected to a first reference signal end CN1, a third end connected to a first clock signal end CK1, a fourth end connected to a first node A, and a fifth end connected to a second node B. The input module 1 is configured to provide a signal from the first reference signal end CN1 to the first node A under the control of the input signal end Input, and provide a signal from the first clock signal end CK1 to the second node B under the control of the first reference signal end CN1.

The reset module 2 has a first end connected to a reset signal end Reset, a second end connected to a second reference signal end CN2, a third end connected to a second clock signal end CK2, a fourth end connected to the first node A, and a fifth end connected to the second node B. The reset module 2 is configured to provide a signal from the second reference signal end CN2 to the first node A under the control of the reset signal end Reset, and provide a signal from the second clock signal end CK2 to the second node B under the control of the second reference signal end CN2.

The first control module 3 has a first end connected to a first direct current signal end VN1, a second end connected to a second direct current signal end VN2, a third end connected to the first node A, a fourth end connected to a third node C, and a fifth end connected to a fourth node D. The first control module 3 is configured to provide a signal from the first direct current signal end VN1 to the third node C under the control of the first node A, provide a signal from the second direct current signal end VN2 to the third node C under the control of the fourth node D, and maintain a potential at the third node C in a stable state when the third node C is in a floating state.

The second control module 4 has a first end connected to the first direct current signal end VN1, a second end connected to the second direct current signal end VN2, a third end connected to the second node B, a fourth end connected to the third node C, and a fifth end connected to the fourth node D. The second control module 4 is configured to provide the signal from the first direct current signal end VN1 to the fourth node D under the control of the second node B, provide the signal from the second direct current signal end VN2 to the fourth node D under the control of the third node C, and maintain a potential at the fourth node D in a stable state when the fourth node D is in a floating state.

The first output module 5 has a first end connected to a third clock signal end CK3, a second end connected to the third node C, and a third end connected to a driving signal output end Output of the shift register. The first output module 5 is configured to provide a signal from the third clock signal end CK3 to the driving signal output end Output under the control of the third node C.

The second output module 6 has a first end connected to the second direct current signal end VN2, a second end connected to the fourth node D, and a third end connected to the driving signal output end Output. The second output module 6 is configured to provide the signal from the second direct current signal end VN2 to the driving signal output end Output under the control of the fourth node D.

The above shift register according to the embodiment of the present disclosure comprises an input module, a reset module, a first control module, a second control module, a first output module, and a second output module. The input module controls potentials at the first node and the second node through the input signal end, the first reference signal end, and the first clock signal end. The reset module controls the potentials at the first node and the second node through the reset signal end, the second reference signal end, and the second clock signal end. The first control module controls the potential at the third node through the first direct current signal end, the second direct current signal end, the first node, and the fourth node. The second control module controls the potential at the fourth node through the first direct current signal end, the second direct current signal end, the second node, and the third node. The first output module controls a potential at the driving signal output end through the third clock signal end and the third node. The second output module controls the potential at the driving signal output end through the second direct current signal end and the fourth node. With cooperation among the above six modules, the shift register enables the potential at the third node for controlling the first output module to be in a stable state under the function of the first control module and enables the potential at the fourth node for controlling the second output module to be in a stable state under the function of the second control module. In this way, stability of the scanning signal output by the driving signal output end of the shift register is achieved, thereby reducing the noise in the scanning signal output by the driving signal output end, and improving the stability of the output of the shift register.

It should be noted that in the above shift register according to the embodiment of the present disclosure, an input signal is output by the input signal end, a first clock signal is output by the first clock signal end, a second clock signal is output by the second clock signal end, a third clock signal is output by the third clock signal end, a first direct current signal is output by the first direct current signal end, a second direct current signal is output by the second direct current signal end, a first reference signal is output by the first reference signal end, a second reference signal is output by the second reference signal end, and a scanning signal is output by the driving signal output end. When an active pulse signal for the input signal is at a high potential, the first direct current signal is at a high potential, and the second direct current signal is at a low potential. Alternatively, when the active pulse signal for the input signal is at a low potential, the first direct current signal is at a low potential, and the second direct current signal is at a high potential.

It should be noted that in the above shift register according to the embodiment of the present disclosure, the first clock signal, the second clock signal and the third clock signal have the same period and the same duty cycle. When the active pulse signal for the input signal is at a high potential, a rising edge of the input signal is aligned with a rising edge of the second clock signal, a falling edge of the input signal is aligned with a falling edge of the second clock signal and a rising edge of the third clock signal, and a rising edge of the first clock signal is aligned with a falling edge of the third clock signal. Alternatively, when the active pulse signal for the input signal is at a low potential, the falling edge of the input signal is aligned with the falling edge of the second clock signal, the rising edge of the input signal is aligned with the rising edge of the second clock signal and the falling edge of the third clock signal, and a falling edge of the first clock signal is aligned with the rising edge of the third clock signal.

Figure 1B:
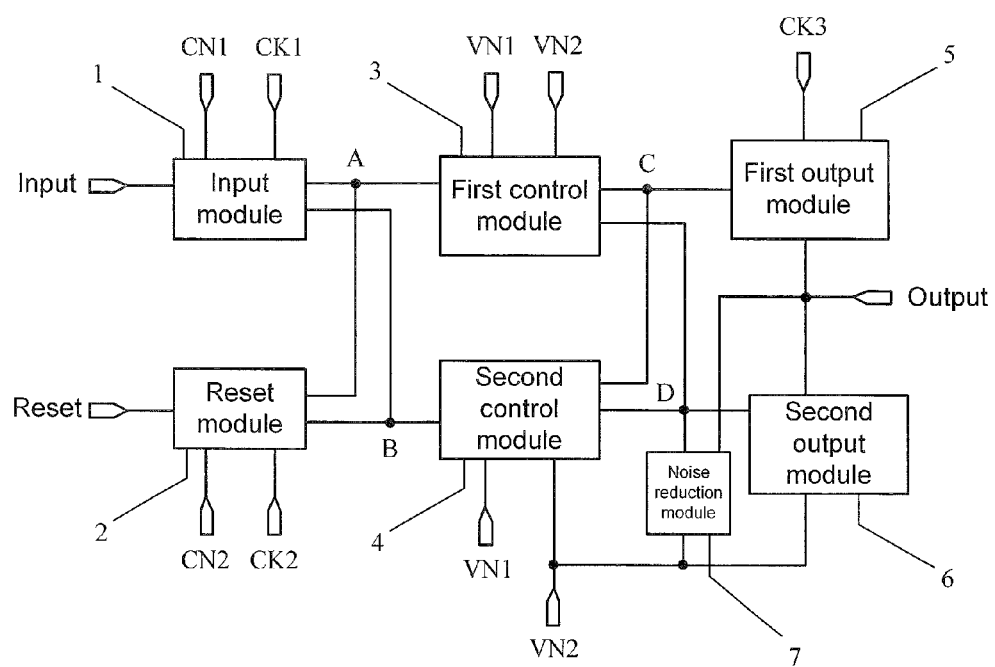
FIG. 1b is another structural diagram of a shift register according to an embodiment of the present disclosure.

Further, in order to ensure that the potential at the fourth node for controlling the second output module in the above shift register according to the embodiment of the present disclosure is in a stable state, as shown in FIG. 1b, the above shift register according to the embodiment of the present disclosure may further comprise a noise reduction module 7.

The noise reduction module 7 has a first end connected to the second direct current signal end VN2, a second end connected to the driving signal output end Output, and a third end connected to the fourth node D. The noise reduction module 7 is configured to provide the signal from the second direct current signal end VN2 to the fourth node D under the control of the driving signal output end Output.

The present disclosure will be described in detail below in conjunction with a specific embodiment. It should be noted that the present embodiment is provided for the purpose of better understanding the present disclosure instead of limiting the present disclosure.

Preferably, in the above shift register according to the embodiment of the present disclosure, as shown in FIGS. 2a-3b, the input module 1 may further comprise a first switch transistor M1 and a second switch transistor M2.

The first switch transistor M1 has a gate connected to the input signal end Input, a source connected to the first reference signal end CN1, and a drain connected to the first node A.

The second switch transistor M2 has a gate connected to the first reference signal end CN1, a source connected to the first clock signal end CK1, and a drain connected to the second node B.

Figure 2A:
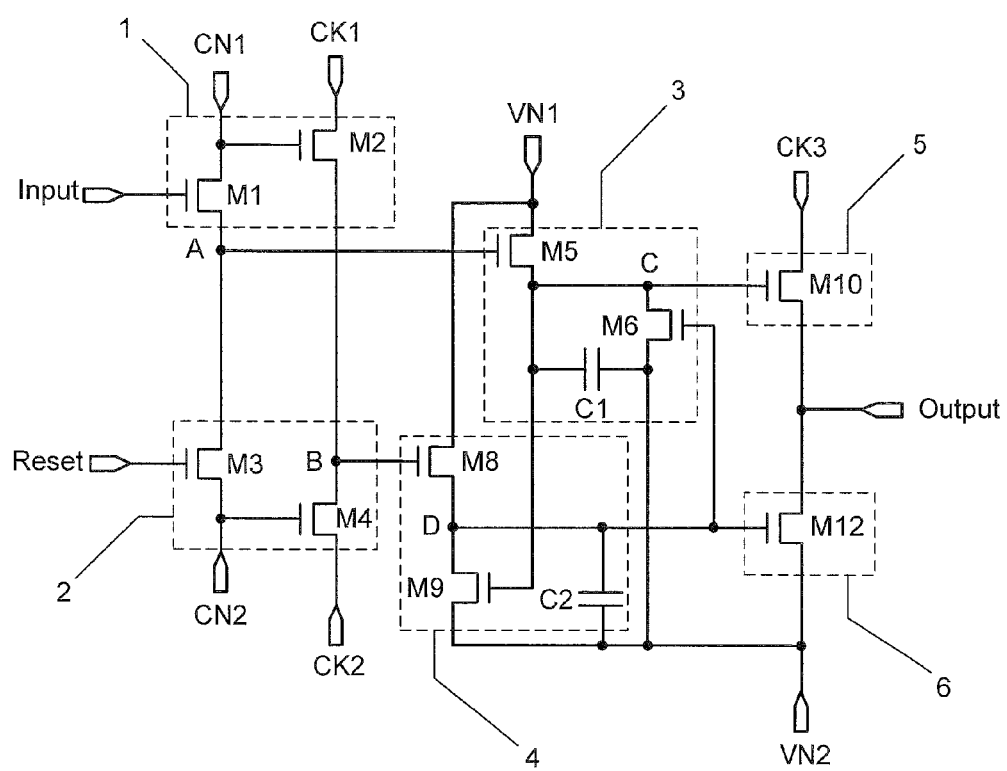
Figure 2B:
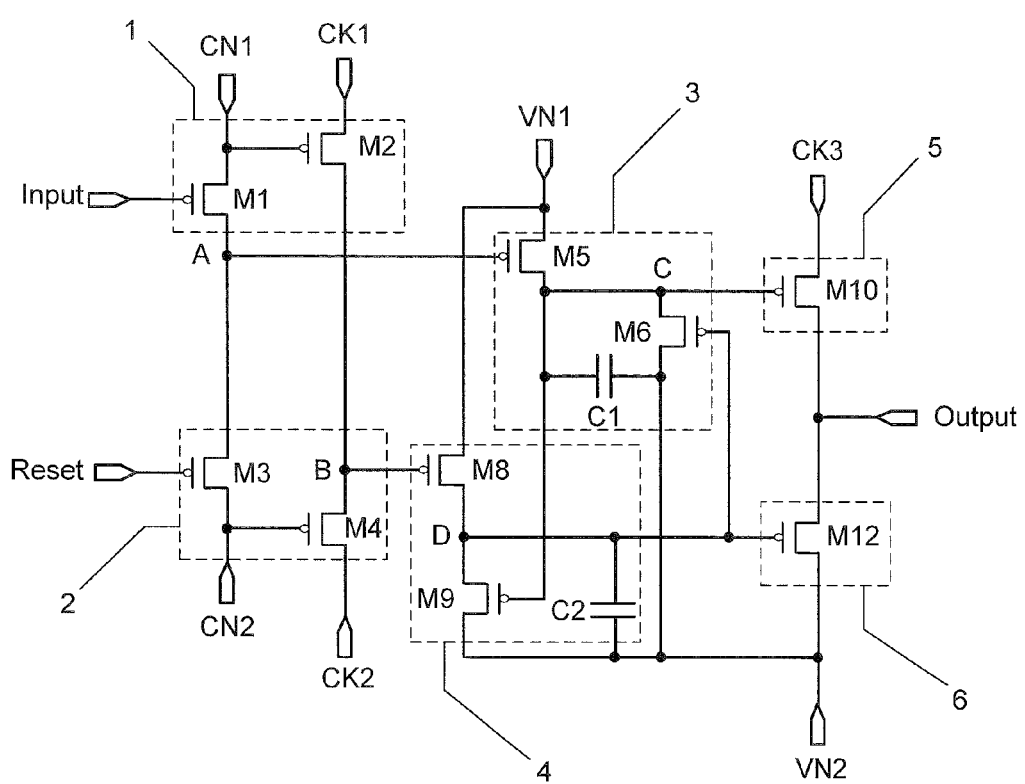
Figure 3A:
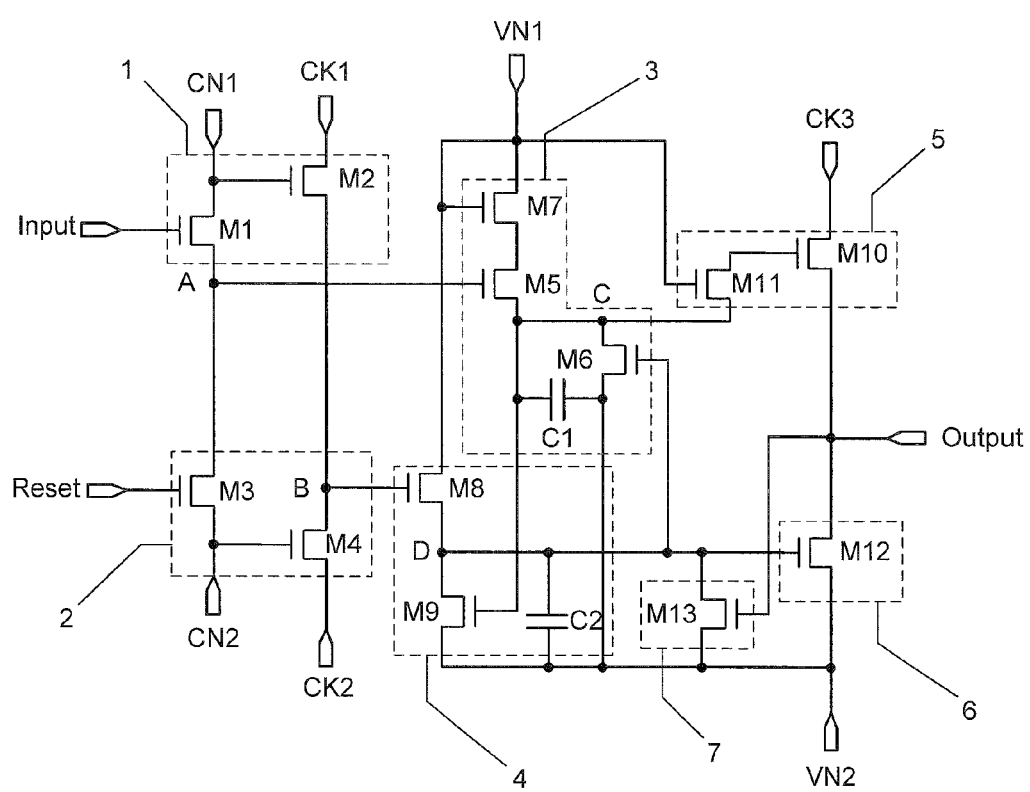
FIG. 3a is a specific structural diagram of the shift register illustrated in FIG. 1b.
Figure 3B:
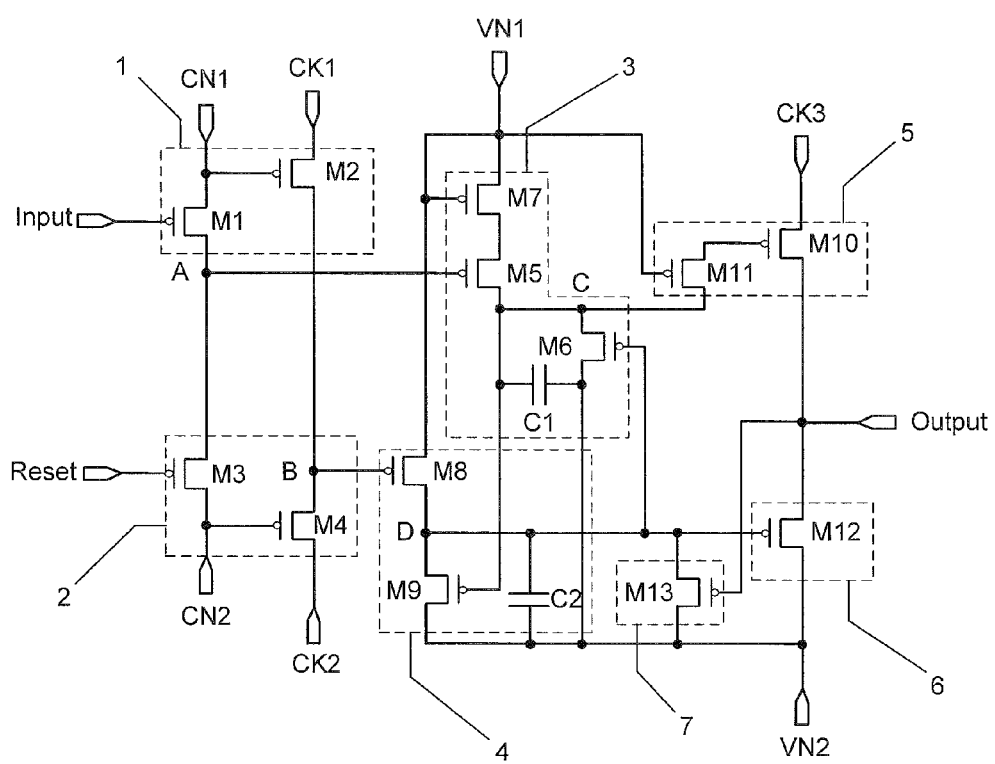
FIG. 3b is another specific structural diagram of the shift register illustrated in FIG. 1b.

Preferably, in a specific embodiment, when a signal from the input signal end Input is at a high potential, as shown in FIGS. 2a and 3a, the first switch transistor M1 and the second switch transistor M2 may be N-type switch transistors; and alternatively, when the signal from the input signal end Input is at a low potential, as shown in FIGS. 2b and 3b, the first switch transistor M1 and the second switch transistor M2 may be P-type switch transistors, which is not limited here.

Further, in a specific embodiment, when the first switch transistor M1 is in an on state under the control of the input signal end Input, the signal from the first reference signal end CN1 is provided to the first node A through the first switch transistor M1, and when the second switch transistor M2 is in an on state under the control of the first reference signal end CN1, the signal from the first clock signal end CK1 is provided to the second node B through the second switch transistor M2.

A specific structure of the input module in the shift register is merely described above by way of example, and in a specific implementation, the specific structure of the input module is not limited to the above structure according to the embodiment of the present disclosure, and may also be another structure well-known by those skilled in the art, which is not limited here.

Preferably, in the above shift register according to the embodiment of the present disclosure, as shown in FIGS. 2a-3b, the reset module 2 may further comprise a third switch transistor M3 and a fourth switch transistor M4.

The third switch transistor M3 has a gate connected to the reset signal end Reset, a source connected to the first node A, and a drain connected to the second reference signal end CN2.

The fourth switch transistor M4 has a gate connected to the second reference signal end CN2, a source connected to the second node B, and a drain connected to the second clock signal end CK2.

Preferably, in a specific embodiment, when the signal from the input signal end Input is at a high potential, as shown in FIGS. 2a and 3a, the third switch transistor M3 and the fourth switch transistor M4 may be N-type switch transistors; and alternatively, when the signal from the input signal end Input is at a low potential, as shown in FIGS. 2b and 3b, the third switch transistor M3 and the fourth switch transistor M4 may be P-type switch transistors, which is not limited here.

Further, in a specific embodiment, when the third switch transistor M3 is in an on state under the control of the reset signal end Reset, the signal from the second reference signal end CN2 is provided to the first node A through the third switch transistor M3, and when the fourth switch transistor M4 is in an on state under the control of the second reference signal end CN2, the signal from the second clock signal end CK2 is provided to the second node B through the fourth switch transistor M4.

A specific structure of the reset module in the shift register is merely described above by way of example, and in a specific implementation, the specific structure of the reset module is not limited to the above structure according to the embodiment of the present disclosure, and may also be another structure well-known by those skilled in the art, which is not limited here.

Preferably, in the above shift register according to the embodiment of the present disclosure, as shown in FIGS. 2a and 2b, the first control module 3 may further comprise a fifth switch transistor M5, a sixth switch transistor M6 and a first capacitor C1.

The fifth switch transistor M5 has a gate connected to the first node A, a source connected to the first direct current signal end VN1, and a drain connected to the third node C.

The sixth switch transistor M6 has a gate connected to the fourth node D, a source connected to the third node C, and a drain connected to the second direct current signal end VN2.

The first capacitor C1 has one end connected to the third node C, and the other end connected to the second direct current signal end VN2.

Preferably, in a specific embodiment, when the signal from the input signal end Input is at a high potential, as shown in FIG. 2a, the fifth switch transistor M5 and the sixth switch transistor M6 may be N-type switch transistors; and alternatively, when the signal from the input signal end Input is at a low potential, as shown in FIG. 2b, the fifth switch transistor M5 and the sixth switch transistor M6 may be P-type switch transistors, which is not limited here.

Further, in a specific implementation, when the fifth switch transistor M5 is in an on state under the control of the first node A, the signal from the first direct current signal end VN1 is provided to the third node C through the fifth switch transistor M5, when the sixth switch transistor M6 is in an on state under the control of the fourth node D, the signal from the second direct current signal end VN2 is provided to the third node C through the sixth switch transistor M6, and when the third node C is in a floating state, the potential at the third node C is maintained in a stable state under the function of the first capacitor C1.

Further, in the above shift register according to the embodiment of the present disclosure, as shown in FIGS. 3a and 3b, the first control module 3 may further comprise a seventh switch transistor M7 connected between the source of the fifth switch transistor M5 and the first direct current signal end VN1. The seventh switch transistor M7 has a gate and a source both connected to the first direct current signal end VN1, and a drain connected to the source of the fifth switch transistor M5.

As the GOA circuit is comprised of multiple shift registers and various stages of shift registers are connected to the same first direct current signal end, when the potentials at the first node and the third node in a certain stage of shift register suddenly are changed due to external factors and thereby voltages at the gate and the source of the fifth switch transistor are changed significantly, if the seventh switch transistor is not arranged, the voltage at the first direct current signal end is unstable, and thereby a signal from the first direct current signal end received by each of remaining various stages of shift registers is also unstable, which results in the input and output of the whole GOA circuit being abnormal. Therefore, when both the gate and the source of the seventh switch transistor are connected to the first direct current signal end, the seventh switch transistor equivalently has a function of unidirectional diode conduction, i.e., only the signal from the first direct current signal end is allowed to be provided to the source of the fifth switch transistor through the seventh switch transistor, and the voltages at the gate and the source of the fifth switch transistor are not allowed to interfere with the signal from the first direct current signal end. Therefore, it ensures that the signal output by the first direct current signal end is in a stable state, thereby ensuring that the signal which is output by first direct current signal end and received by each of the remaining various stages of shift registers is in a stable state, and improving the stability of the output of the driving signal output end.

Preferably, in a specific implementation, when the signal from the input signal end Input is at a high potential, as shown in FIG. 3a, the seventh switch transistor M7 may be an N-type switch transistor; and alternatively, when the signal from the input signal end Input is at a low potential, as shown in FIG. 3b, the seventh switch transistor M7 may be a P-type switch transistor, which is not limited here.

Further, in a specific embodiment, when the seventh switch transistor M7 is in an on state under the control of the first direct current signal end VN1, the signal from the first direct current signal end VN1 is provided to the source of the fifth switch transistor M5 through the seventh switch transistor M7.

A specific structure of the first control module in the shift register is merely described above by way of example, and in a specific implementation, the specific structure of the first control module is not limited to the above structure according to the embodiment of the present disclosure, and may also be another structure well-known by those skilled in the art, which is not limited here.

Preferably, in the above shift register according to the embodiment of the present disclosure, as shown in FIGS. 2a-3b, the second control module 4 may further comprise an eighth switch transistor M8, a ninth switch transistor M9 and a second capacitor C2.

The eighth switch transistor M8 has a gate connected to the second node B, a source connected to the first direct current signal end VN1, and a drain connected to the fourth node D.

The ninth switch transistor M9 has a gate connected to the third node C, a source connected to the fourth node D, and a drain connected to the second direct current signal end VN2.

The second capacitor C2 has one end connected to the fourth node D and the other end connected to the second direct current signal end VN2.

Preferably, in a specific implementation, when the signal from the input signal end Input is at a high potential, as shown in FIGS. 2a and 3a, the eighth switch transistor M8 and the ninth switch transistor M9 may be N-type switch transistors; and alternatively, when the signal from the input signal end Input is at a low potential, as shown in FIGS. 2b and 3b, the eighth switch transistor M8 and the ninth switch transistor M9 may be P-type switch transistors, which is not limited here.

Further, in a specific embodiment, when the eighth switch transistor M8 is in an on state under the control of the second node B, the signal from the first direct current signal end VN1 is provided to the fourth node D through the eighth switch transistor M8, when the ninth switch transistor M9 is in an on state under the control of the third node C, the signal from the second direct current signal end VN2 is provided to the fourth node D through the ninth switch transistor M9, and when the fourth node D is in a floating state, the potential at the fourth node D is maintained in a stable state under the function of the second capacitor C2.

A specific structure of the second control module in the shift register is merely described above by way of example, and in a specific implementation, the specific structure of the second control module is not limited to the above structure according to the embodiment of the present disclosure, and may also be another structure well-known by those skilled in the art, which is not limited here.

Preferably, in the above shift register according to the embodiment of the present disclosure, as shown in FIGS. 2a and 2b, the first output module 5 may further comprise a tenth switch transistor M10. The tenth switch transistor M10 has a gate connected to the third node C, a source connected to the third clock signal end CK3, and a drain connected to the driving signal output end Output.

Preferably, in a specific embodiment, when the signal from the input signal end Input is at a high potential, as shown in FIG. 2a, the tenth switch transistor M10 may be an N-type switch transistor; and alternatively, when the signal from the input signal end Input is at a low potential, as shown in FIG. 2b, the tenth switch transistor M10 may be a P-type switch transistor, which is not limited here.

Further, in a specific implementation, when the tenth switch transistor M10 is in an on state under the control of the third node C, the signal from the third clock signal end CK3 is provided to the driving signal output end Output through the tenth switch transistor M10.

Further, in a specific embodiment, the tenth switch transistor generally has a larger manufacturing size than those of other switch transistors, that is, parasitic capacitance of the tenth switch transistor per se is large. In this case, when the third node is in a floating state, the parasitic capacitance of the tenth switch transistor per se may be used to control the potential at the third node.

Further, in a specific embodiment, in the above shift register according to the embodiment of the present disclosure, as shown in FIGS. 3a and 3b, the first control module 3 may further comprise an eleventh switch transistor M11 connected between the gate of the tenth switch transistor M10 and the third node C. The eleventh switch transistor M11 has a gate connected to the first direct current signal end VN1, a source connected to the gate of the tenth switch transistor M10, and a drain connected to the third node C. As the tenth switch transistor M10 has a large size and thus has large parasitic capacitance, when the third node C is in a floating state, potentials at the gate E of the tenth switch transistor M10 and the source of the eleventh switch transistor M11 are further pulled up under a bootstrap function of the tenth switch transistor M10. A voltage difference between the gate and the source of the eleventh switch transistor M11 is not enough to switch the eleventh switch transistor M11 on, and thus the eleventh switch transistor M11 is switched off by itself. As a result, it effectively ensures the potential at the gate E of the tenth switch transistor M10 is not provided to the third node C through the eleventh switch transistor M11, which ensures that the potential at the third node C is in a stable state. Further, it effectively ensures that the potential at the gate E of the tenth switch transistor M10 is maintained in a pull-up state, which ensures that the tenth switch transistor M10 is switched on and the signal from the third clock signal end CK3 is provided to the driving signal output end Output through the tenth switch transistor M10. Therefore, the noise in the scanning signal output from the driving signal output end Output is reduced, and the stability of the output of the driving signal output end Output is improved.

Preferably, in a specific embodiment, when the signal from the input signal end Input is at a high potential, as shown in FIG. 3a, the eleventh switch transistor M11 may be an N-type switch transistor; and alternatively, when the signal from the input signal end Input is at a low potential, as shown in FIG. 3b, the eleventh switch transistor M11 may be a P-type switch transistor, which is not limited here.

Further, in a specific implementation, when the eleventh switch transistor M11 is in an on state under the control of the first direct current signal end VN1, the potential at the third node C is provided to the gate E of the tenth switch transistor M10 through the eleventh switch transistor M11.

A specific structure of the first output module in the shift register is merely described above by way of example, and in a specific implementation, the specific structure of the first output module is not limited to the above structure according to the embodiment of the present disclosure, and may also be another structure well-known by those skilled in the art, which is not limited here.

Preferably, in the above shift register according to the embodiment of the present disclosure, as shown in FIGS. 2a-3b, the second output module 6 may further comprise a twelfth switch transistor M12. The twelfth switch transistor M12 has a gate connected to the fourth node D, a source connected to the driving signal output end Output, and a drain connected to the second direct current signal end VN2.

Preferably, in a specific embodiment, when the signal from the input signal end Input is at a high potential, as shown in FIGS. 2a and 3a, the twelfth switch transistor M12 may be an N-type switch transistor; and alternatively, when the signal from the input signal end Input is at a low potential, as shown in FIGS. 2b and 3b, the twelfth switch transistor M12 may be a P-type switch transistor, which is not limited here.

Further, in a specific implementation, when the twelfth switch transistor M12 is in an on state under the control of the fourth node D, the signal from the second direct current signal end VN2 is provided to the driving signal output end Output through the twelfth switch transistor M12.

A specific structure of the second output module in the shift register is merely described above by way of example, and in a specific implementation, the specific structure of the second output module is not limited to the above structure according to the embodiment of the present disclosure, and may also be another structure well-known by those skilled in the art, which is not limited here.

Preferably, in the above shift register according to the embodiment of the present disclosure, as shown in FIGS. 3a and 3b, the noise reduction module 7 may further comprise a thirteenth switch transistor M13. The thirteenth switch transistor M13 has a gate connected to the driving signal output end Output, a source connected to the fourth node D, and a drain connected to the second direct current signal end VN2. Thus, when the first output module 5 enables the scanning signal output which is output by the driving signal output end Output to be an active signal under the control of the third node C, the thirteenth switch transistor M13 is switched on and the signal from the second direct current signal end VN2 is provided to the fourth node D through the thirteenth switch transistor M13, which further ensures that the twelfth switch transistor M12 is in an off state. In this way, it ensures that the potential at the fourth node D is in a stable state, thereby reducing the noise in the scanning signal output from the driving signal output end Output and improving the stability of the output of the driving signal output end Output.

Preferably, in a specific implementation, when the signal from the input signal end Input is at a high potential, as shown in FIG. 3a, the thirteenth switch transistor M13 may be an N-type switch transistor; and alternatively, when the signal from the input signal end Input is at a low potential, as shown in FIG. 3b, the thirteenth switch transistor M13 may be a P-type switch transistor, which is not limited here.

Further, in a specific implementation, when the thirteenth switch transistor M13 is in an on state under the control of the driving signal output end Output, the signal from the second direct current signal end VN2 is provided to the fourth node D through the thirteenth switch transistor M13.

A specific structure of the noise reduction module in the shift register is merely described above by way of example, and in a specific implementation, the specific structure of the noise reduction module is not limited to the above structure according to the embodiment of the present disclosure, and may also be another structure well-known by those skilled in the art, which is not limited here.

Preferably, in the above shift register according to the embodiment of the present disclosure, the switch transistors are generally made of the same material. In a specific implementation, when the active pulse signal for the input signal is at a high potential, all of the switch transistors are N-type transistors; and when the active pulse signal for the input signal is at a low potential, all of the switch transistors are P-type transistors.

Further, in a specific embodiment, the N-type switch transistor is switched on under the function of a high potential, and is switched off under the function of a low potential, and the P-type switch transistor is switched off under the function of a high potential and is switched on under the function of a low potential.

It should be noted that all of the switch transistors mentioned in the above embodiment of the present disclosure are Metal Oxide Semiconductor (MOS) field effect transistors. In a specific embodiment, a source and a drain of each of these transistors may have interchangeable functions according to a type of the transistor and an input signal, and thus are not specifically distinguished here.

Further, as in the above shift register according to the embodiment of the present disclosure, the input module and the reset module are designed symmetrically and may achieve functional interchange, the above shift register according to the embodiment of the present disclosure may achieve bidirectional scanning. During backward scanning, functions of the input module and the reset module in the shift register are interchanged. That is, compared to forward scanning, the reset module is used as an input module, the reset signal end is used as an input signal end, the input module is used as a reset module, and the input signal end is used as a reset signal end. When an active pulse signal for the reset signal output by the reset signal end is at a high potential, a first direct current signal output by the first direct current signal end is at a high potential, a second direct current signal output by the second direct current signal end is at a low potential, a first reference signal output by the first reference signal end is at a low potential, and a second reference signal output by the second reference signal end is at a high potential. Alternatively, when the active pulse signal for the reset signal is at a low potential, the first direct current signal is at a low potential, the second direct current signal is at a high potential, the first reference signal is at a high potential, and the second reference signal end is at a low potential. Further, when the active pulse signal for the reset signal is at a high potential, a rising edge of the reset signal is aligned with a rising edge of the first clock signal and a falling edge of the third clock signal, a falling edge of the reset signal is aligned with a falling edge of the first clock signal, and a falling edge of the second clock signal is aligned with a rising edge of the third clock signal. Alternatively, when the active pulse signal for the reset signal is at a low potential, the falling edge of the reset signal is aligned with the falling edge of the first clock signal and the rising edge of the third clock signal, the rising edge of the reset signal is aligned with the rising edge of the first clock signal, and a rising edge of the second clock signal is aligned with the falling edge of the third clock signal.

Operation processes of the above shift registers according to the embodiments of the present disclosure will be described respectively in conjunction with circuit timing diagrams by taking forward scanning as an example. As the second reference signal is at a low potential and the fourth switch transistor is always in an off state during forward scanning, the second clock signal cannot be provided to the second node through the fourth switch transistor, i.e., the second clock signal does not play a role in the operation processes of the above shift registers, which will no longer be repeated in the following description of the specific operation processes. In the following description, 1 represents a high potential signal, 0 represents a low potential signal, input represents an input signal, reset represents a reset signal, output represents a scanning signal, ck1 represents a first clock signal, ck3 represents a third clock signal, cn1 represents a first reference signal, cn2 represents a second reference signal, vn1 represents a first direct current signal, and vn2 represents a second direct current signal.

First Example

Figure 4A:
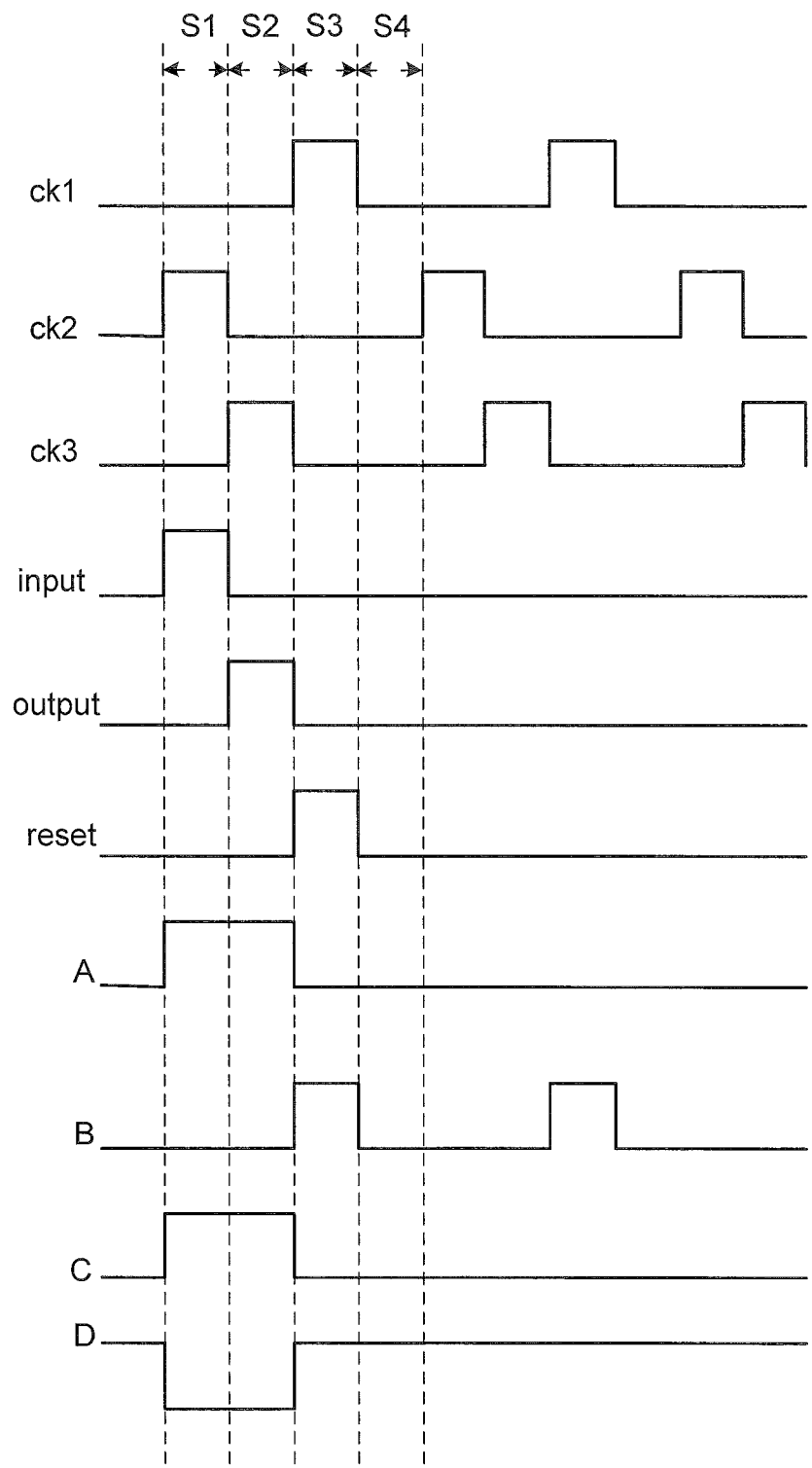

An operation process of a shift register will be described by taking a structure of the shift register illustrated in FIG. 2a as an example. In the shift register illustrated in FIG. 2a, all of the switch transistors are N-type switch transistors, and various N-type switch transistors are switched on under the function of a high potential, and are switched off under the function of a low potential; the first direct current signal vn1 is at a high potential, and the second direct current signal vn2 is at a low potential; the first reference signal cn1 is at a high potential, and the second reference signal cn2 is at a low potential; and corresponding input and output timing diagrams are illustrated in FIG. 4a. Specifically, four phases, i.e., an input phase S1, an output phase S2, a reset phase S3 and a reset-hold phase S4 in the input and output timing diagrams illustrated in FIG. 4a are selected.

In the input phase S1, ck1=0, ck3=0, input=1 and reset=0.

As reset=0, the third switch transistor M3 is switched off. As the first reference signal cn1 is at a high potential, the second switch transistor M2 is switched on. As ck1=0, the second switch transistor M2 is switched on and the first clock signal ck1 is provided to the second node B through, the second node B is at a low potential. As the second node B is at a low potential, the eighth switch transistor M8 is switched off. As input=1, the first switch transistor M1 is switched on and the first reference signal cn1 at a high potential is provided to the first node A, and the first node A is at a high potential. As the first node A is at a high potential, the fifth switch transistor M5 is switched on. As the fifth switch transistor M5 is switched on and the first direct current signal vn1 at a high potential is provided to the third node C, the third node C is at a high potential, and the first capacitor C1 starts to be charged to maintain the potential at the third node C in a stable state. As the third node C is at a high potential, the ninth switch transistor M9 and the tenth switch transistor M10 are switched on. As the ninth switch transistor M9 is switched on and the second direct current signal vn2 at a low potential is provided to the fourth node D, the fourth node D is at a low potential. As the fourth node D is at a low potential, both the sixth switch transistor M6 and the twelfth switch transistor M12 are switched off. As ck3=0,the tenth switch transistor M10 is switched on and the third clock signal ck3 is provided to the driving signal output end Output, a scanning signal output at a low potential is output by the driving signal output end Output.

In the output phase S2, ck1=0, ck3=1, input=0 and reset=0.

As reset=0, the third switch transistor M3 is switched off. As the first reference signal cn1 is at a high potential, the second switch transistor M2 is switched on. As ck1=0, the second switch transistor M2 is switched on and the first clock signal ck1 is provided to the second node B, and the second node B is at a low potential. As the second node B is at a low potential, the eighth switch transistor M8 is switched off. As input=0, the first switch transistor M1 is switched off. As both the first switch transistor M1 and the third switch transistor M3 are switched off, the third node C is in a floating state. As the third node C is in a floating state, the potential at the third node C is maintained at a high potential as in the phase S1 under the function of the first capacitor C1 to ensure that both the ninth switch transistor M9 and the tenth switch transistor M10 are switched on in this phase. As the ninth switch transistor M9 is switched on and the second direct current signal vn2 at a low potential is provided to the fourth node D, the fourth node D is at a low potential. As the fourth node D is at a low potential, both the sixth switch transistor M6 and the twelfth switch transistor M12 are switched off. As ck3=1, the tenth switch transistor M10 is switched on and the third clock signal ck3 is provided to the driving signal output end Output, a scanning signal output at a high potential is output by the driving signal output end Output.

In the reset phase S3, ck1=1, ck3=0, input=0 and reset=1.

As input=0, the first switch transistor M1 is switched off. As reset=1, the third switch transistor M3 is switched on. As the third switch transistor M3 is switched on and the second reference signal cn2 at a low potential is provided to the first node A, the first node A is at a low potential. As the first node A is at a low potential, the fifth switch transistor M5 is switched off. As the first reference signal cn1 is at a high potential, the second switch transistor M2 is switched on. As ck1=1, the second switch transistor M2 is switched on and the first clock signal ck1 is provided to the second node B through the second switch transistor M2, the second node B is at a high potential. As the second node B is at a high potential, the eighth switch transistor M8 is switched on. As the eighth switch transistor M8 is switched on and the first direct current signal vn1 at a high potential is provided to the fourth node D, the fourth node D is at a high potential, and the second capacitor C2 starts to be charged to maintain the potential at the fourth node D in a stable state. As the fourth node D is at a high potential, both the sixth switch transistor M6 and the twelfth switch transistor M12 are switched on. As the sixth switch transistor M6 is switched on and the second direct current signal vn2 at a low potential is provided to the third node C, the third node C is at a low potential. As the third node C is at a low potential, both the ninth switch transistor M9 and the tenth switch transistor M10 are switched off. As the twelfth switch transistor M12 is switched on and the second direct current signal vn2 at a low potential is provided to the driving signal output end Output, a scanning signal output at a low potential is output by the driving signal output end Output.

In the reset-hold phase S4, ck1=0, ck3=0, input=0 and reset=0.

As input=0, the first switch transistor M1 is switched off. As reset=0, the third switch transistor M3 is switched off. As both the first switch transistor M1 and the third switch transistor M3 are switched off, the first node A is in a floating state. As the first node A is in a floating state, the potential at the first node A is maintained at a low potential under the bootstrap function of the fifth switch transistor M5, to ensure that the fifth switch transistor M5 is switched off in this phase. As the first reference signal cn1 is at a high potential, the second switch transistor M2 is switched on. As ck1=0, the second switch transistor M2 is switched on and the first clock signal ck1 is provided to the second node B, the second node B is at a low potential. As the second node B is at a low potential, the eighth switch transistor M8 is switched off, and the fourth node D is in a floating state. As the fourth node D is in a floating state, the potential at the fourth node D is maintained at a high potential as in the phase S3 under the function of the second capacitor C2. As the fourth node D is at a high potential, both the sixth switch transistor M6 and the twelfth switch transistor M12 are switched on. As the sixth switch transistor M6 is switched on and the second direct current signal vn2 at a low potential is provided to the third node C, the third node C is at a low potential. As the third node C is at a low potential, both the ninth switch transistor M9 and the tenth switch transistor M10 are switched off. As the twelfth switch transistor M12 is switched on and the second direct current signal vn2 at a low potential is provided to the driving signal output end Output, a scanning signal output at a low potential is output by the driving signal output end Output.

In the above shift register according to the embodiment of the present disclosure, after the reset-hold phase, each time ck1=1, the second capacitor starts to be charged so that the second capacitor maintains the fourth node to be at a high potential in a stable state when ck1=0. In this case, it ensures that the sixth switch transistor is switched on and the second direct current signal at a low potential is provided to the third node, so that the third node is at a low potential in a stable state and thus the tenth switch transistor is switched off. This ensures that the twelfth switch transistor is switched on and the second direct current signal at a low potential is provided to the driving signal output end. Therefore, a scanning signal at a low potential is stably output by the driving signal output end until a next frame starts.

In the above shift register according to the embodiment of the present disclosure, in the input phase, the potential at the third node is maintained in stable state under the function of the first capacitor, and in the output phase, the potential at the fourth node is maintained in a stable state under the function of the third node and the ninth switch transistor, without influencing the potential at the third node. In the reset-hold phase, the potential at the fourth node is maintained in a stable state under the function of the second capacitor, without influencing the potential at the third node, to ensure that the scanning signal from the driving signal output end of the shift register is output stably, thereby reducing the noise in the scanning signal and improving the stability of the output of the shift register.

Second Example

Figure 4B:
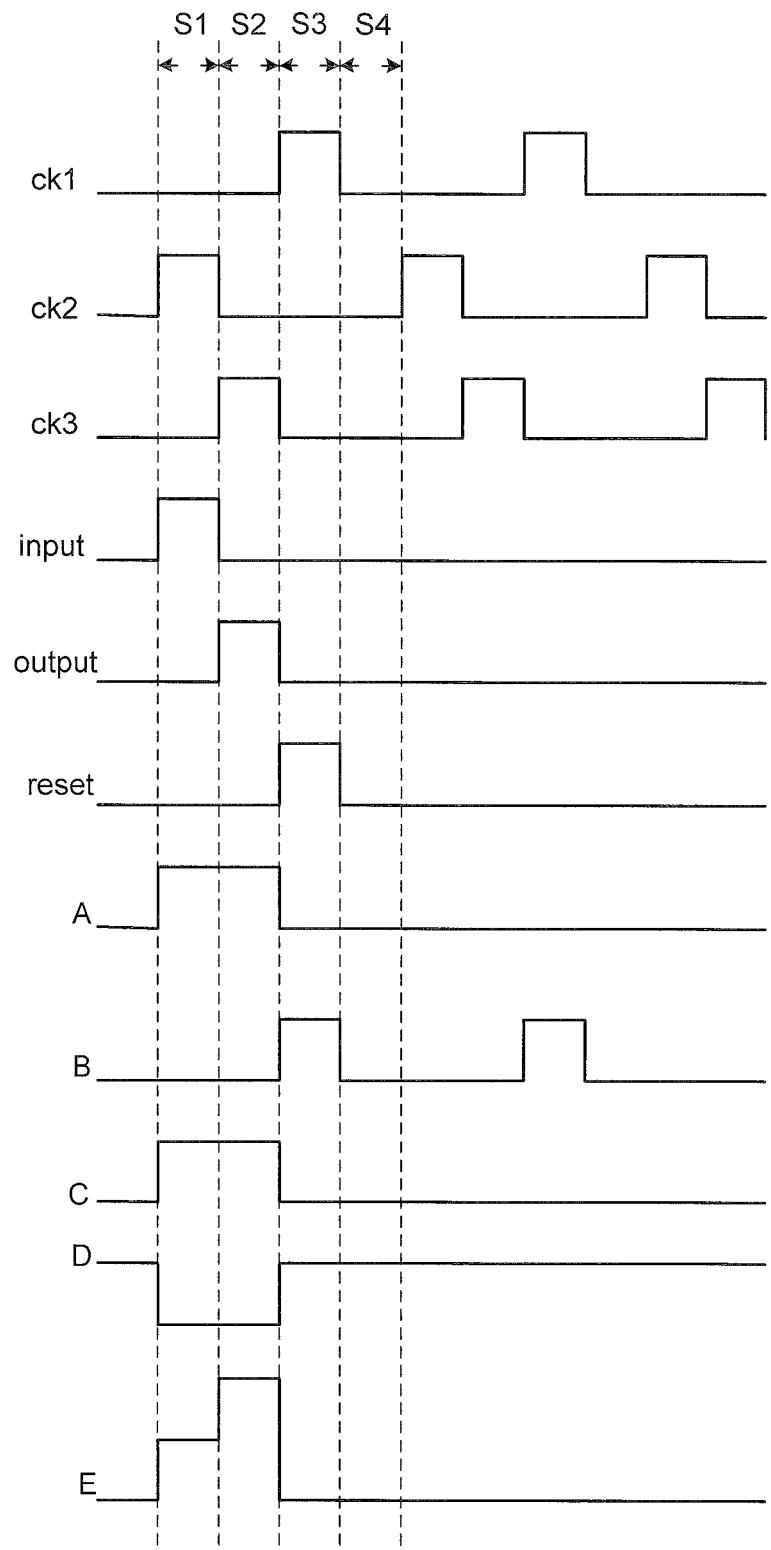
FIG. 4b is a circuit timing diagram of the shift register illustrated in FIG. 2b.

An operation process of a shift register will be described by taking a structure of the shift register illustrated in FIG. 3a as an example. In the shift register illustrated in FIG. 3a, all of the switch transistors are N-type switch transistors, and various N-type switch transistors are switched on under the function of a high potential, and are switched off under the function of a low potential; the first direct current signal vn1 is at a high potential, and the second direct current signal vn2 is at a low potential; the first reference signal cn1 is at a high potential, and the second reference signal cn2 is at a high potential; and corresponding input and output timing diagrams are illustrated in FIG. 4b. Specifically, four phases, i.e., an input phase S1, an output phase S2, a reset phase S3 and a reset-hold phase S4 in the input and output timing diagrams illustrated in FIG. 4b are selected.

In the four phases, i.e., the input phase S1, the output phase S2, the reset phase S3 and the reset-hold phase S4, as the first direct current signal vn1 is at a high potential, both the seventh switch transistor M7 and the eleventh switch transistor M11 are switched on.

In the input phase S1, ck1=0, ck3=0, input=1 and reset=0.

As reset=0, the third switch transistor M3 is switched off. As the first reference signal cn1 is at a high potential, the second switch transistor M2 is switched on. As ck1=0, the second switch transistor M2 is switched on and the first clock signal ck1 is provided to the second node B, the second node B is at a low potential. As the second node B is at a low potential, the eighth switch transistor M8 is switched off. As input=1, the first switch transistor M1 is switched on and the first reference signal cn1 at a high potential is provided to the first node A, and thus the first node A is at a high potential. As the first node A is at a high potential, the fifth switch transistor M5 is switched on. As the seventh switch transistor M7 is switched on, the first direct current signal vn1 at a high potential is provided to the source of the fifth switch transistor M5, the fifth switch transistor M5 is switched on, and the first direct current signal vn1 at a high potential is provided to the third node C, the third node C is at a high potential and the first capacitor C1 starts to be charged to maintain the potential at the third node C in a stable state. As the third node C is at a high potential, both the ninth switch transistor M9 and the tenth switch transistor M10 are switched on. As the ninth switch transistor M9 is switched on and the second direct current signal vn2 at a low potential is provided to the fourth node D, the fourth node D is at a low potential. As the fourth node D is at a low potential, both the sixth switch transistor M6 and the twelfth switch transistor M12 are switched off. As the eleventh switch transistor M11 is switched on and the potential at the third node C is provided to the gate E of the tenth switch transistor M10, the gate E of the tenth switch transistor M10 is at a high potential, and thus the tenth switch transistor M10 is switched on. As ck3=0, the tenth switch transistor M10 is switched on and the third clock signal ck3 is provided to the driving signal output end Output, a scanning signal output at a low potential is output by the driving signal output end Output. As the scanning signal output is at a low potential, the thirteenth switch transistor M13 is switched off.

In the output phase S2, ck1=0, ck3=1, input=0 and reset=0.

As reset=0, the third switch transistor M3 is switched off. As the first reference signal cn1 is at a high potential, the second switch transistor M2 is switched on. As ck1=0, the second switch transistor M2 is switched on and the first clock signal ck1 is provided to the second node B, the second node B is at a low potential. As the second node B is at a low potential, the eighth switch transistor M8 is switched off. As input=0, the first switch transistor M1 is switched off. As both the first switch transistor M1 and the third switch transistor M3 are switched off, the third node C is in a floating state. As the third node C is in a floating state, the potential at the third node C is maintained at a high potential as in the phase S1 under the function of the first capacitor C1 to ensure that the ninth switch transistor M9 is switched on in this phase. As the ninth switch transistor M9 is switched on and the second direct current signal vn2 at a low potential is provided to the fourth node D, the fourth node D is at a low potential. As the fourth node D is at a low potential, both the sixth switch transistor M6 and the twelfth switch transistor M12 are switched off. As the tenth switch transistor M10 has a large size and thus has large parasitic capacitance, the potential at the gate E of the tenth switch transistor M10 is further pulled up under the bootstrap function of the parasitic capacitance of the tenth switch transistor M10, to ensure that the tenth switch transistor M10 is switched on in this stage. A voltage difference between the gate and the source of the eleventh switch transistor M11 is not enough to switch the eleventh switch transistor M11 on, and thus the eleventh switch transistor M11 is switched off by itself. As a result, it effectively ensures that the potential at the gate E of the tenth switch transistor M10 is not provided to the third node C through the eleventh switch transistor M11, which ensures that the third node C is at a high potential in a stable state. Further, it avoids a large voltage difference between the source and the drain of the sixth switch transistor M6 which influences the life time thereof. As ck3=1, the tenth switch transistor M10 is switched on and the third clock signal ck3 is provided to the driving signal output end Output, a scanning signal output at a high potential is output by the driving signal output end Output. As the scanning signal output is at a high potential, the thirteenth switch transistor M13 is switched on. As the thirteenth switch transistor M13 is switched on and the second direct current signal vn2 at a low potential is provided to the fourth node D, it effectively ensures that the fourth node D is maintained at a low potential in a stable state, thereby reducing the noise in the scanning signal output from the driving signal output end Output, and improving the stability of the output of the driving signal output end Output.

In the reset phase S3, ck1=1, ck3=0, input=0 and reset=1.

As input=0, the first switch transistor M1 is switched off. As reset=1, the third switch transistor M3 is switched on. As the third switch transistor M3 is switched on and the second reference signal cn2 at a low potential is provided to the first node A through the third switch transistor M3, the first node A is at a low potential. As the first node A is at a low potential, the fifth switch transistor M5 is switched off. As the first reference signal cn1 is at a high potential, the second switch transistor M2 is switched on. As ck1=1, the second switch transistor M2 is switched on and the first clock signal ck1 is provided to the second node B, the second node B is at a high potential. As the second node B is at a high potential, the eighth switch transistor M8 is switched on. As the eighth switch transistor M8 is switched on and the first direct current signal vn1 at a high potential is provided to the fourth node D, the fourth node D is at a high potential, and the second capacitor C2 starts to be charged to maintain the potential at the fourth node D in a stable state. As the fourth node D is at a high potential, both the sixth switch transistor M6 and the twelfth switch transistor M12 are switched on. As the sixth switch transistor M6 is switched on and the second direct current signal vn2 at a low potential is provided to the third node C, the third node C is at a low potential. As the third node C is at a low potential, the eleventh switch transistor M11 is switched on and the potential at the third node C is provided to the gate E of the tenth switch transistor M10, the gate E of the tenth switch transistor M10 is at a low potential, and the tenth switch transistor M10 is switched off. As the twelfth switch transistor M12 is switched on and the second direct current signal vn2 at a low potential is provided to the driving signal output end Output, a scanning signal output at a low potential is output by the driving signal output end Output. As the scanning signal output is at a low potential, the thirteenth switch transistor M13 is switched off.

In the reset-hold phase S4, ck1=0, ck3=0, input=0 and reset=0.

As input=0, the first switch transistor M1 is switched off. As reset=0, the third switch transistor M3 is switched off. As both the first switch transistor M1 and the third switch transistor M3 are switched off, the first node A is in a floating state. As the first node A is in a floating state, the potential at the first node A is maintained at a low potential under the bootstrap function of the fifth switch transistor M5, to ensure that the fifth switch transistor M5 is switched off in this phase. As the first reference signal cn1 is at a high potential, the second switch transistor M2 is switched on. As ck1=0, the second switch transistor M2 is switched on and the first clock signal ck1 is provided to the second node B, the second node B is at a low potential. As the second node B is at a low potential, the eighth switch transistor M8 is switched off, and the fourth node D is in a floating state. As the fourth node D is in a floating state, the fourth node D is maintained at a high potential under the bootstrap function of the second capacitor C2 to ensure that the potential at the fourth node D is maintained in a stable state. As the fourth node D is at a high potential, both the sixth switch transistor M6 and the twelfth switch transistor M12 are switched on. As the sixth switch transistor M6 is switched on and the second direct current signal vn2 at a low potential is provided to the third node C, the third node C is at a low potential. As the third node C is at a low potential, the eleventh switch transistor M11 is switched on and the potential at the third node C is provided to the gate E of the tenth switch transistor M10, the gate E of the tenth switch transistor M10 is at a low potential, and thus the tenth switch transistor M10 is switched off. As the twelfth switch transistor M12 is switched on and the second direct current signal vn2 at a low potential is provided to the driving signal output end Output, a scanning signal output at a low potential is output by the driving signal output end Output. As the scanning signal output is at a low potential, the thirteenth switch transistor M13 is switched off.

In the above shift register according to the embodiment of the present disclosure, after the reset-hold phase, each time ck1=1, the second capacitor starts to be charged so that the second capacitor maintains the fourth node to be at a high potential in a stable state when ck1=0. It ensures that the sixth switch transistor is switched on and the second direct current signal at a low potential is provided to the third node, so that the gate of the tenth switch transistor is at a low potential and thus the tenth switch transistor is switched off. Further, it ensures that the twelfth switch transistor is switched on and the second direct current signal at a low potential is provided to the driving signal output end through the twelfth switch transistor. Therefore, a scanning signal at a low potential is output by the driving signal output end until a next frame starts.

In the above shift register according to the embodiment of the present disclosure, it further ensures that the signal output by the first direct current signal end is in a stable state under the function of the seventh switch transistor. In the input phase, the potential at the third node is maintained in stable state under the function of the first capacitor. In the output phase, the potential at the gate of the tenth switch transistor is maintained in a stable pull-up state under the function of the eleventh switch transistor, and the potential at the fourth node is maintained in a stable state under the function of the ninth switch transistor and the thirteenth switch transistor, without influencing the potential at the third node. In the reset-hold phase, the potential at the fourth node is maintained in a stable state under the function of the second capacitor, without influencing the potential at the third node, to ensure that the scanning signal from the driving signal output end of the shift register is output stably, thereby reducing the noise in the scanning signal and improving the stability of the output of the shift register.

Figure 4C:
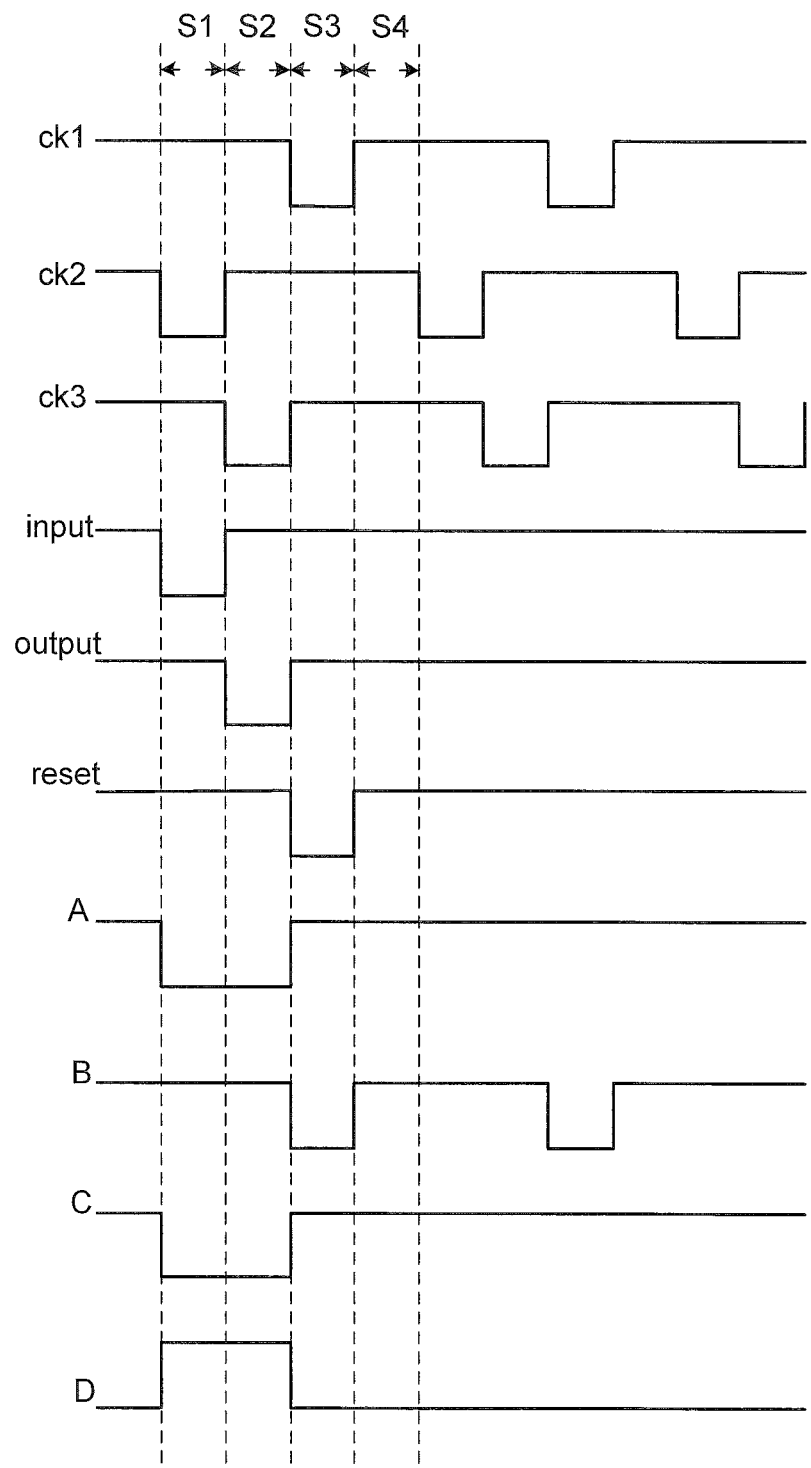
Figure 4D:
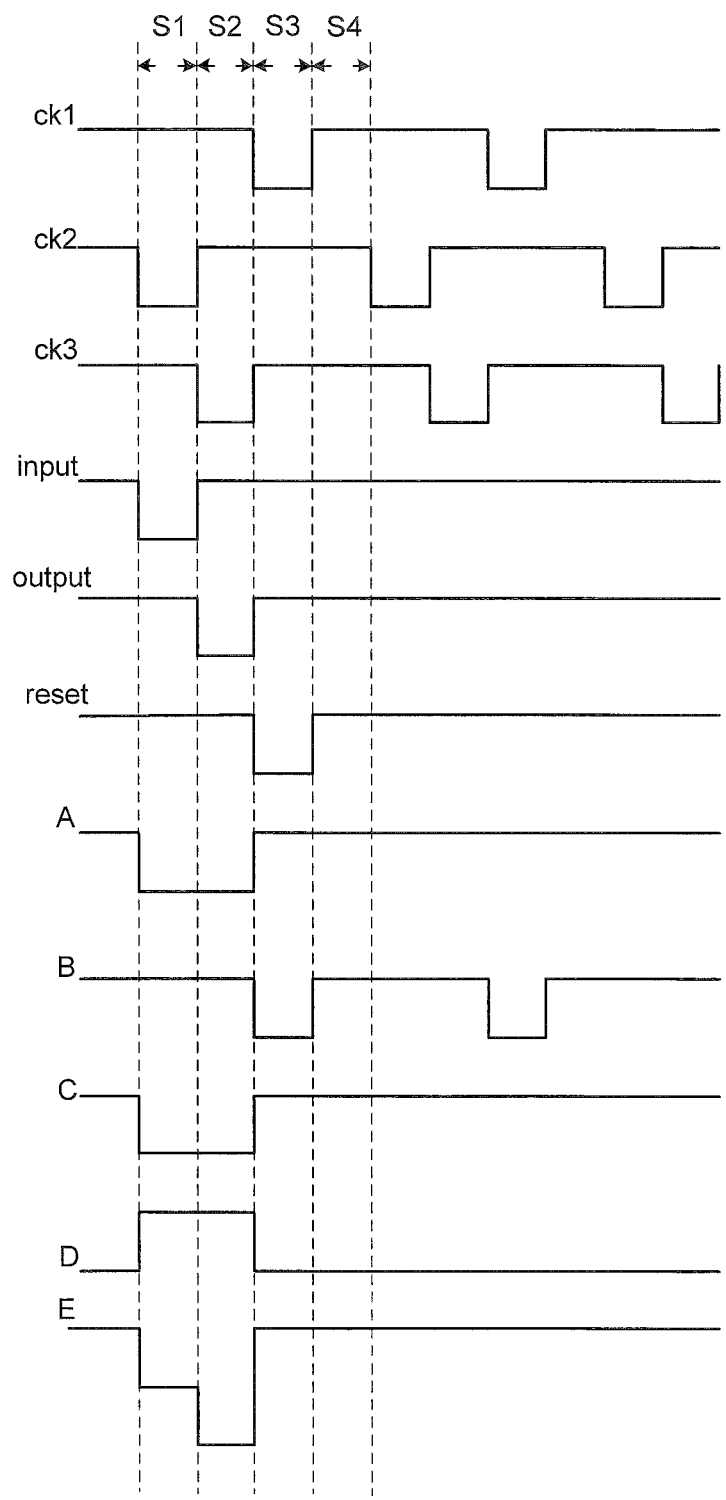
FIG. 4d is a circuit timing diagram of the shift register illustrated in FIG. 3b.

It should be noted that in the above shift registers according to the embodiments of the present disclosure, as shown in FIGS. 2b and 3b, all of the switch transistors are P-type switch transistors, and various P-type switch transistors are switched off under the function of a high potential and are switched on under the function of a low potential. Specific operation principles with respect to the structures of the shift registers illustrated in FIGS. 3a and 3b in conjunction with the corresponding input and output timing diagrams of FIGS. 4c and 4d are the same as those in the first and second examples, and will not be described here.

Based on the same inventive concept, the embodiments of the present disclosure further provide a method for driving any of the shift registers described above. The method comprises an input phase, an output phase, a reset phase, and a reset-hold phase.

In the input phase, the input module provides the signal from the first reference signal end to the first node under the control of the input signal end, and provides the signal from the first clock signal end to the second node under the control of the first reference signal end; the first control module provides the signal from the first direct current signal end to the third node under the control of the first node; the second control module provides the signal from the second direct current signal end to the fourth node under the control of the third node; and the first output signal end provides the signal from the third clock signal end to the driving signal output end under the control of the third node.

In the output phase, the input module provides the signal from the first clock signal end to the second node under the control of the first reference signal end; the first control module maintains the potential at the third node in a stable state; the second control module provides the signal from the second direct current signal end to the fourth node under the control of the third node; and the first output module provides the signal from the third clock signal end to the driving signal output end under the control of the third node.

In the reset phase, the input module provides the signal from the first clock signal end to the second node under the control of the first reference signal end; the reset module provides the second reference signal to the first node under the control of the reset signal end; the first control module provides the signal from the second direct current signal end to the third node under the control of the fourth node; the second control module provides the signal from the first direct current signal end to the fourth node under the control of the second node; and the second output module provides the signal from the second direct current signal end to the driving signal output end under the control of the fourth node.

In the reset-hold phase, the input module provides the signal from the first clock signal end to the second node under the control of the first reference signal end; the first control module provides the signal from the second direct current signal end to the third node under the control of the fourth node; the second control module maintains the potential at the fourth node in a stable state; and the second output module provides the signal from the second direct current signal end to the driving signal output end under the control of the fourth node.

Further, in a specific implementation, in the above driving method according to the embodiment of the present disclosure, in the output phase, the noise reduction module provides the signal from the second direct current signal end to the fourth node under the control of the driving signal output end.

It should be noted that in the above driving method according to the embodiment of the present disclosure, in the input phase, the first capacitor effectively ensures that the potential at the third node is in a stable state, in the output phase, the ninth switch transistor and the thirteenth switch transistor effectively ensure that the potential at the fourth node is in a stable state, and in the reset phase, the second capacitor effectively ensures that the potential at the fourth node is in a stable state, to ensure the scanning signal from the driving signal output end of the shift register to be output stably, thereby reducing the noise in the scanning signal and improving the stability of the output of the shift register.

Figure 5:
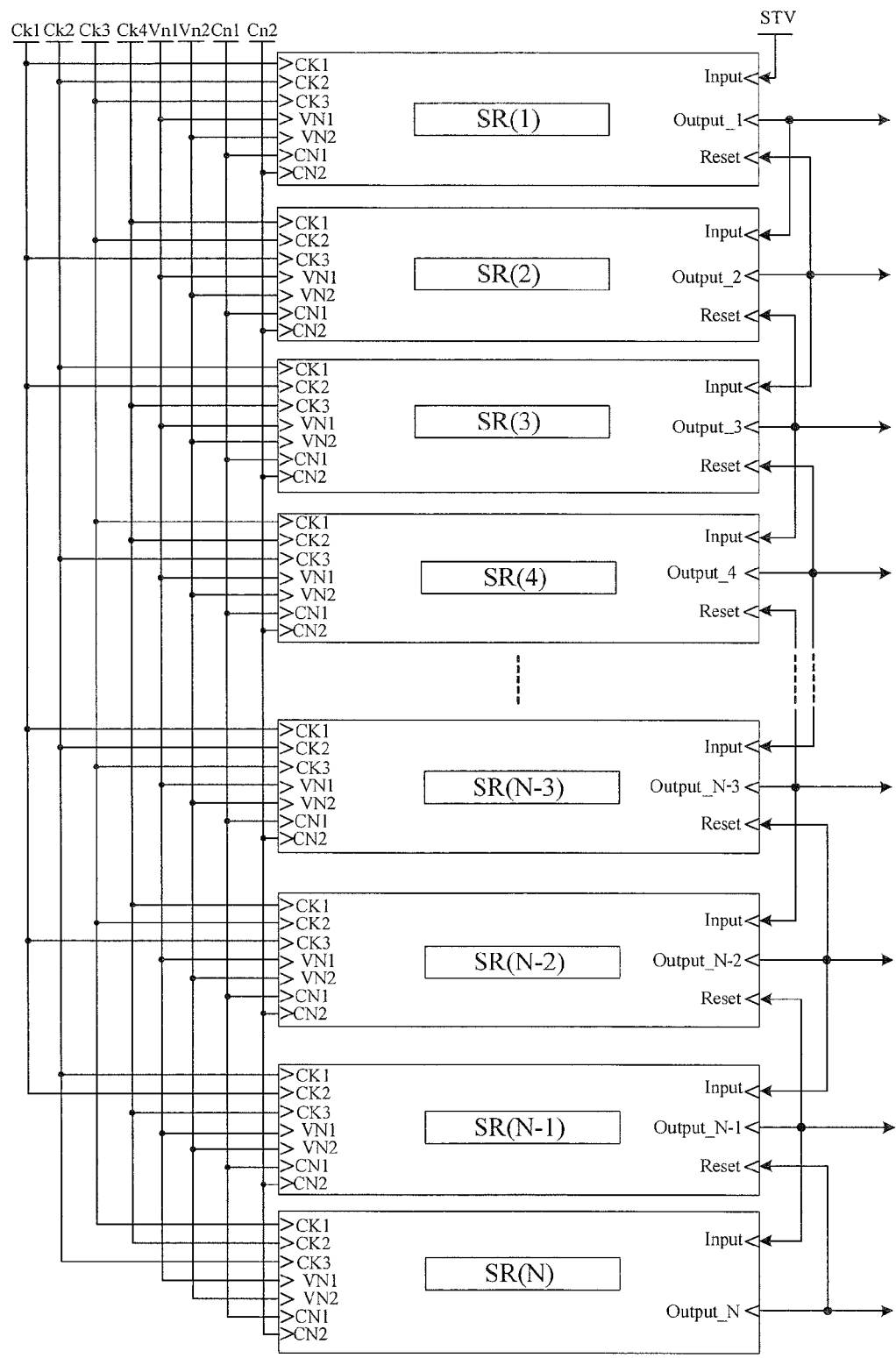
FIG. 5 is a structural diagram of a gate driving circuit according to an embodiment of the present disclosure.

Based on the same inventive concept, the embodiments of the present disclosure further provide a gate driving circuit, as shown in FIG. 5, comprising multiple cascaded shift registers, which are SR(1), SR(2)... SR(n)... SR(N−1), SR(N) (totally N shift registers, wherein 1≤n≤N). An input signal end Input of the first stage of shift register SR(1) is connected to a frame trigger signal end STV, and each of input signal ends Input of remaining various stages of shift registers SR(n) except for the first stage of shift register SR(1) is connected to a driving signal output end Output_n−1 of a previous stage of shift register SR(n−1). Each of reset signal ends Reset of the remaining various stages of shift registers SR(n) except for a last stage of shift register is connected to a driving signal output end Output_n+1 of a next stage of shift register SR(n+1).

Further, in the above gate driving circuit according to the present disclosure, each of the various stages of shift registers comprises an input signal end, a reset signal end, a driving signal output end, a first clock signal end, a second clock signal end, a third clock signal end, a first reference signal end, a second reference signal end, a first direct current signal end, and a second direct current signal end.

Specifically, in the above gate driving circuit according to the present disclosure, as shown in FIG. 5, a first clock signal end CK1 of a $4n+1^{th}$ stage of shift register, a third clock signal end CK3 of a $4n+2^{th}$ stage of shift register, and a second clock signal end CK2 of a $4n+3^{th}$ stage of shift register are connected to the same clock signal end Ck1. A second clock signal end CK2 of the $4n+1^{th}$ stage of shift register, a first clock signal end CK1 of the $4n+3^{th}$ stage of shift register, and a third clock signal end CK3 of a $4n+4^{th}$ stage of shift register are connected to the same clock signal end Ck2. A third clock signal end CK3 of the $4n+1^{th}$ stage of shift register, a second clock signal end CK2 of the $4n+2^{th}$ stage of shift register, and a first clock signal end CK1 of the $4n+4^{th}$ stage of shift register are connected to the same clock signal end Ck3. A first clock signal end CK1 of the $4n+2^{th}$ stage of shift register, a third clock signal end CK3 of the $4n+3^{th}$ stage of shift register, and a second clock signal end CK2 of the $4n+4^{th}$ stage of shift register are connected to the same clock signal end Ck4.

In the above gate driving circuit, during backward scanning for gate lines, functions of an input module and a reset module of each shift register are interchanged. That is, compared to forward scanning, during backward scanning, for each shift register, the reset module is used as an input module, the reset signal end is used as an input signal end, the input module is used as a reset module, and the input signal end is used as a reset signal end. In this case, a connection relationship of the circuit does not change, and merely the function of the circuit changes.

Based on the same inventive concept, the embodiments of the present disclosure further provide a display apparatus, comprising the gate driving circuit described above. Scanning signals are provided by the gate driving circuit to various gate lines on an array substrate in the display apparatus. A specific implementation thereof can be known with reference to the description of the gate driving circuit described above, and the same content will no longer be repeated.

The embodiments of the present disclosure provide the shift register and the method for driving the same, the gate driving circuit and the display apparatus described above. The shift register comprises an input module, a reset module, a first control module, a second control module, a first output module and a second output module. The input module controls the potential at the first node through the input signal end and the first reference signal end, and controls the potential at the second node through the first reference signal end and the first clock signal end. The reset module controls the potential at the first node through the reset signal end and the second reference signal end, and controls the potential at the second node through the second reference signal end and the second clock signal end. The first control module controls the potential at the third node through the first direct current signal end, the second direct current signal end, the first node, and the fourth node. The second control module controls the potential at the fourth node through the first direct current signal end, the second direct current signal end, the second node, and the third node. The first output module adjusts the potential at the driving signal output end through the third clock signal end and the third node. The second output module adjusts the potential at the driving signal output end through the second direct current signal end and the fourth node. With cooperation among the above six modules, the shift register enables the potential at the third node for controlling the first output module to be in a stable state under the function of the first control module and enables the potential at the fourth node for controlling the second output module to be in a stable state under the function of the second control module. In this way, stability of the scanning signal output by the driving signal output end of the shift register is achieved, thereby reducing the noise in the scanning signal output by the driving signal output end, and improving the stability of the output of the shift register.

Obviously, those skilled in the art can make various modifications and variations to the present disclosure without departing from the spirit and scope of the present disclosure. Thus, if these modifications and variations of the present disclosure belong to the scope of the claims of the present disclosure and the equivalent technologies thereof, the present disclosure is also intended to include these modifications and variations.

I claim:

1. A shift register, comprising:
    an input module having a first end connected to an input signal end, a second end connected to a first reference signal end, a third end connected to a first clock signal end, a fourth end connected to a first node, and a fifth end connected to a second node, the input module being configured to provide a signal from the first reference signal end to the first node under the control of the input signal end, and provide a signal from the first clock signal end to the second node under the control of the first reference signal end;
    a reset module having a first end connected to a reset signal end, a second end connected to a second reference signal end, a third end connected to a second clock signal end, a fourth end connected to the first node, and a fifth end connected to the second node, the reset module being configured to provide a signal from the second reference signal end to the first node under the control of the reset signal end, and provide a signal from the second clock signal end to the second node under the control of the second reference signal end;
    a first control module having a first end connected to a first direct current signal end, a second end connected to a second direct current signal end, a third end connected to the first node, a fourth end connected to a third node, and a fifth end connected to a fourth node, the first control module being configured to provide a signal from the first direct current signal end to the third node under the control of the first node, provide a signal from the second direct current signal end to the third node under the control of the fourth node, and maintain a potential at the third node in a stable state when the third node is in a floating state;
    a second control module having a first end connected to the first direct current signal end, a second end connected to the second direct current signal end, a third end connected to the second node, a fourth end connected to the third node, and a fifth end connected to the fourth node, the second control module being configured to provide the signal from the first direct current signal end to the fourth node under the control of the second node, provide the signal from the second direct current signal end to the fourth node under the control of the third node, and maintain a potential at the fourth node in a stable state when the fourth node is in a floating state;
    a first output module having a first end connected to a third clock signal end, a second end connected to the third node, and a third end connected to a driving signal output end of the shift register, the first output module being configured to provide a signal from the third clock signal end to the driving signal output end under the control of the third node; and
    a second output module having a first end connected to the second direct current signal end, a second end connected to the fourth node, and a third end connected to the driving signal output end, the second output module being configured to provide the signal from the second direct current signal end to the driving signal output end under the control of the fourth node.

2. The shift register according to claim 1, further comprising: a noise reduction module, having a first end connected to the second direct current signal end, a second end connected to the driving signal output end, and a third end connected to the fourth node, the noise reduction module being configured to provide the signal from the second direct current signal end to the fourth node under the control of the driving signal output end.

3. The shift register according to claim 1, wherein the input module comprises:
    a first switch transistor having a gate connected to the input signal end, a source connected to the first reference signal end, and a drain connected to the first node; and
    a second switch transistor having a gate connected to the first reference signal end, a source connected to the first clock signal end, and a drain connected to the second node.

4. The shift register according to claim 1, wherein the reset module comprises:
    a third switch transistor having a gate connected to the reset signal end, a source connected to the first node, and a drain connected to the second reference signal end; and
    a fourth switch transistor having a gate connected to the second reference signal end, a source connected to the second node, and a drain connected to the second clock signal end.

5. The shift register according to claim 1, wherein the first control module comprises:
    a fifth switch transistor having a gate connected to the first node, a source connected to the first direct current signal end, and a drain connected to the third node;
    a sixth switch transistor having a gate connected to the fourth node, a source connected to the third node, and a drain connected to the second direct current signal end; and a first capacitor having one end connected to the third node and the other end connected to the second direct current signal end.

6. The shift register according to claim 5, wherein the first control module further comprises a seventh switch transistor connected between the source of the fifth switch transistor and the first direct current signal end, and the seventh switch transistor has a gate and a source both connected to the first direct current signal end, and a drain connected to the source of the fifth switch transistor.

7. The shift register according to claim 1, wherein the second control module comprises:

an eighth switch transistor having a gate connected to the second node, a source connected to the first direct current signal end, and a drain connected to the fourth node;

a ninth switch transistor having a gate connected to the third node, a source connected to the fourth node, and a drain connected to the second direct current signal end; and a second capacitor having one end connected to the fourth node and the other end connected to the second direct current signal end.

8. The shift register according to claim 1, wherein the first output module comprises a tenth switch transistor, and the tenth switch transistor has a gate connected to the third node, a source connected to the third clock signal end, and a drain connected to the driving signal output end.

9. The shift register according to claim 8, wherein the first output module further comprises an eleventh switch transistor connected between the gate of the tenth switch transistor and the third node, wherein the eleventh switch transistor has a gate connected to the first direct current signal end, a source connected to the gate of the tenth switch transistor, and a drain connected to the third node.

10. The shift register according to claim 1, wherein the second output module comprises a twelfth switch transistor having a gate connected to the fourth node, a source connected to the driving signal output end, and a drain connected to the second direct current signal end.

11. The shift register according to claim 2, wherein the noise reduction module comprises a thirteenth switch transistor having a gate connected to the driving signal output end, a source connected to the fourth node, and a drain connected to the second direct current signal end.

12. The shift register according to claim 3, wherein when an active pulse signal for the signal from the input signal end is at a high potential, both the first switch transistor and the second switch transistor are N-type switch transistors; and when the active pulse signal for the signal from the input signal end is at a low potential, both the first switch transistor and the second switch transistor are P-type switch transistors.

13. The shift register according to claim 4, wherein when an active pulse signal for the signal from the input signal end is at a high potential, both the third switch transistor and the fourth switch transistor are N-type switch transistors; and when the active pulse signal for the signal from the input signal end is at a low potential, both the third switch transistor and the fourth switch transistor are P-type switch transistors.

14. The shift register according to claim 5, wherein when an active pulse signal for the signal from the input signal end is at a high potential, both the fifth switch transistor and the sixth switch transistor are N-type switch transistors; and when the active pulse signal for the signal from the input signal end is at a low potential, both the fifth switch transistor and the sixth switch transistor are P-type switch transistors.

15. The shift register according to claim 7, wherein when an active pulse signal for the signal from the input signal end is at a high potential, both the eighth switch transistor and the ninth switch transistor are N-type switch transistors; and when the active pulse signal for the signal from the input signal end is at a low potential, both the eighth switch transistor and the ninth switch transistor are P-type switch transistors.

16. The shift register according to claim 8, wherein when an active pulse signal for the signal from the input signal end is at a high potential, the tenth switch transistor is an N-type switch transistor; and when the active pulse signal for the signal from the input signal end is at a low potential, the tenth switch transistor is a P-type switch transistor.

17. A method for driving the shift register according to claim 1, comprising:

in an input phase, providing, by the input module, the signal from the first reference signal end to the first node under the control of the input signal end, and providing the signal from the first clock signal end to the second node under the control of the first reference signal end; providing, by the first control module, the signal from the first direct current signal end to the third node under the control of the first node; providing, by the second control module, the signal from the second direct current signal end to the fourth node under the control of the third node; and providing, by the first output signal end, the signal from the third clock signal end to the driving signal output end under the control of the third node;

in an output phase, providing, by the input module, the signal from the first clock signal end to the second node under the control of the first reference signal end; maintaining, by the first control module, the potential at the third node in a stable state; providing, by the second control module, the signal from the second direct current signal end to the fourth node under the control of the third node; and providing, by the first output module, the signal from the third clock signal end to the driving signal output end under the control of the third node;

in a reset phase, providing, by the input module, the signal from the first clock signal end to the second node under the control of the first reference signal end; providing, by the reset module, the second reference signal to the first node under the control of the reset signal end; providing, by the first control module, the signal from the second direct current signal end to the third node under the control of the fourth node; and providing, by the second control module, the signal from the first direct current signal end to the fourth node under the control of the second node; and providing, by the second output module, the signal from the second direct current signal end to the driving signal output end under the control of the fourth node; and in a reset-hold phase, providing, by the input module, the signal from the first clock signal end to the second node under the control of the first reference signal end; providing, by the first control module, the signal from the second direct current signal end to the third node under the control of the fourth node; maintaining, by the second control module, the potential at the fourth node in a stable state; and providing, by the second output module, the signal from the second direct current signal end to the driving signal output end under the control of the fourth node.

18. The method according to claim 17, further comprising: in the output phase, providing the signal from the second direct current signal end to the fourth node under the control of the driving signal output end.

19. A gate driving circuit, comprising multiple cascaded shift registers according to claim 1, wherein,
an input signal end of a first stage of shift register is connected to a frame trigger signal end;
each of input signal ends of remaining various stages of shift registers except for the first stage of shift register is connected to a driving signal output end of a previous stage of shift register; and
each of reset signal ends of the remaining various stages of shift registers except for a last stage of shift register is connected to a driving signal output end of a next stage of shift register.

20. A display apparatus comprising the gate driving circuit according to claim 19.

\* \* \* \* \*